(12) United States Patent
Pisharodi

(10) Patent No.: US 11,028,830 B2
(45) Date of Patent: Jun. 8, 2021

(54) MULTIMODAL RENEWABLE ENERGY GENERATION SYSTEM

(71) Applicant: Madhavan Pisharodi, Brownsville, TX (US)

(72) Inventor: Madhavan Pisharodi, Brownsville, TX (US)

(73) Assignee: PERUMALA HOLDINGS, LLC, Brownsville, TX (US)

( * ) Notice: Subject to any disclaimer, the term of this patent is extended or adjusted under 35 U.S.C. 154(b) by 0 days.

(21) Appl. No.: 16/929,555

(22) Filed: Jul. 15, 2020

(65) Prior Publication Data

US 2021/0017959 A1 Jan. 21, 2021

Related U.S. Application Data

(60) Provisional application No. 62/875,785, filed on Jul. 18, 2019.

(51) Int. Cl.

| | |
|---|---|
| *F03D 9/00* | (2016.01) |
| *B60K 17/22* | (2006.01) |
| *H02K 7/18* | (2006.01) |
| *H02K 7/00* | (2006.01) |
| *F03D 9/25* | (2016.01) |
| *H02S 10/20* | (2014.01) |
| *H02S 10/40* | (2014.01) |
| *F03D 9/32* | (2016.01) |
| *H02S 10/12* | (2014.01) |

(Continued)

(52) U.S. Cl.
CPC .............. *F03D 9/007* (2013.01); *B60K 17/22* (2013.01); *F03D 9/008* (2013.01); *F03D 9/25* (2016.05); *F03D 9/32* (2016.05); *F03D 13/25* (2016.05); *H02K 7/003* (2013.01); *H02K 7/116* (2013.01); *H02K 7/183* (2013.01); *H02S 10/12* (2014.12); *H02S 10/20* (2014.12); *H02S 10/40* (2014.12)

(58) Field of Classification Search
CPC . F03D 9/008; F03D 9/25; F03D 9/007; F03D 13/25; H02S 10/12; H02K 7/183; H02K 7/116
USPC ............................ 290/42, 43, 44, 53, 54, 55
See application file for complete search history.

(56) References Cited

U.S. PATENT DOCUMENTS

| | | | | |
|---|---|---|---|---|
| 5,140,856 A | * | 8/1992 | Larsen | .................... G01M 1/28 73/455 |
| 6,948,905 B2 | * | 9/2005 | Horjus | ..................... F03D 3/02 415/4.2 |

(Continued)

*Primary Examiner* — Charles Reid, Jr.
(74) *Attorney, Agent, or Firm* — D'Ambrosio & Menon, PLLC; Usha Menon

(57) ABSTRACT

A multimodal renewable energy generation system for generating electric power from more than one renewable energy source is disclosed herein. The system includes two or more spinner units configured on a vertical pillar. The spinner units are configured for rotation under influence of a stream of a corresponding fluid. A set of electric power generators is operatively coupled to each of the two or more spinner units to generate electric power when the corresponding spinner unit rotates. At least one of the two or more spinner units is configured close to a base portion of the pillar to harness power from sea waves and remaining of the two or more spinner units are configured with an upper portion of the pillar for harnessing power from wind. The spinner units are configured for rotation in a horizontal plane even at less powerful winds or water streams.

31 Claims, 14 Drawing Sheets

(51) Int. Cl.
*F03D 13/25* (2016.01)
*H02K 7/116* (2006.01)

(56) References Cited

U.S. PATENT DOCUMENTS

| | | |
|---|---|---|
| 9,287,428 B2 | 3/2016 | Pisharodi |
| 10,079,571 B2 | 9/2018 | Pisharodi |
| 10,097,135 B2 | 10/2018 | Pisharodi |
| 2002/0158472 A1 | 10/2002 | Robson |
| 2009/0261595 A1* | 10/2009 | Poo ............................ F03D 3/02 290/55 |
| 2009/0267347 A1* | 10/2009 | Abatemarco ........... F03B 13/10 290/43 |
| 2010/0066090 A1 | 3/2010 | Newcomer |
| 2010/0219645 A1 | 9/2010 | Yamamoto et al. |
| 2010/0244450 A1* | 9/2010 | Tabe ......................... F03D 9/25 290/53 |
| 2010/0276933 A1 | 11/2010 | Costas |
| 2011/0187102 A1* | 8/2011 | Sirseth .................... F03D 9/008 290/42 |
| 2011/0215650 A1* | 9/2011 | Slocum ................... F03B 13/12 307/72 |
| 2011/0254275 A1* | 10/2011 | Joseph .................... F03D 15/10 290/53 |
| 2012/0032444 A1* | 2/2012 | Burton .................... F03B 13/22 290/53 |
| 2012/0091717 A1* | 4/2012 | Roe ....................... F03B 17/066 290/53 |
| 2013/0140823 A1* | 6/2013 | Henry .................... F03B 13/20 290/53 |
| 2014/0203564 A1 | 7/2014 | Pitre |
| 2014/0367969 A1 | 12/2014 | Pitre et al. |
| 2016/0254781 A1 | 9/2016 | Pisharodi |

\* cited by examiner

MULTIMODAL RENEWABLE ENERGY GENERATION SYSTEM

CROSS-REFERENCE TO RELATED APPLICATION

This application claims priority from U.S. Provisional Patent Application No. 62/875,785 filed on Jul. 18, 2019, the entire disclosure of which is part of the disclosure of the present application and is hereby incorporated by reference in its entirety.

TECHNICAL FIELD

The present disclosure relates generally to the field of renewable energy generation systems. In particular, it pertains to a multimodal renewable energy generation system capable of generating electricity from more than one renewable energy sources.

BACKGROUND

The background description includes information that may be useful in understanding the present invention. It is not an admission that any of the information provided herein is prior art or relevant to the presently claimed invention, or that any publication specifically or implicitly referenced is prior art.

Because of limited availability of conventional fossil fuels, such as coal, petroleum products and other hydrocarbon energy sources, and disadvantages associated with them, there is a greater emphasis on generation and use of electricity from renewable energy sources. The renewable energy sources are environmentally friendly and practically unlimited in supply.

Systems that generate electricity from the renewable energy sources are well known in the related art. For example, Photovoltaic panels, such as those described in Applicant's prior U.S. Pat. Nos. 9,287,428, 10,079,571 and 10,097,135 and Patent. Publication Number 20160254781, all of which are incorporated by reference herein, windmills and water wheels are respectively used for tapping energy from solar radiations, wind and water currents. Typically, these are standalone systems that harness energy from one of the renewable energy sources, and suffer from drawback of inability to provide power when the corresponding renewable energy source is not available. For example, Photovoltaic panels are unable to provide power in night, or under cloudy conditions, when there is no solar radiation. Likewise, windmills are unable to generate electricity when wind velocity is inadequate.

In view of above, conventional renewable energy power generation systems suffer from drawback of lack of continuous power generation and have to incorporate power storage means, such as a battery bank, to store power for consumption when there is no generation of power, or depend on grid power, making the power generation systems expensive and difficult to maintain. This leads to a reduced acceptance of the renewable energy power generation systems.

SUMMARY

There is a need for an improved renewable energy power generation system that is able to generate power using more than one renewable energy sources so that at least one of these renewable energy sources is likely to be available at any given instance, thereby improving efficiency and acceptance of renewable energy power generation systems.

A multimodal renewable energy generation system is provided to solve above-described limitations of conventional renewable energy generation systems. In an aspect of the present disclosure, the proposed renewable energy generation system includes two or more spinner units configured on a vertical pillar such that each of these spinner units rotates freely under influence of a stream of a corresponding fluid. A set of electric power generators is operatively coupled to each of the two or more spinner units to generate electric power when the corresponding spinner unit rotates under the influence of the stream of the corresponding fluid.

In an aspect, at least one of the two or more spinner units is configured close to a base portion of the pillar such that it rotates under influence of a stream of water, and the remaining spinner units are configured with an upper portion of the pillar such that they rotate under influence of wind, i.e. a stream of air.

According to an embodiment, the two or more spinner units are configured for rotation in a horizontal plane about an axis coinciding with a longitudinal axis of the vertical pillar.

According to an embodiment, each of the two or more spinner units may have a plurality of blades that may be cup shaped. The cup shaped blades may be configured such that force exerted by the stream of the corresponding fluid on concave side of the blades is more than force exerted by the same stream on convex side of the blades to make the spinner unit rotate in a preferred direction, and only in that direction.

According to an embodiment, each of the two or more spinner units may be mounted on the pillar through a set of bearings. The set of bearings may be arranged between the pillar and the spinner unit in a stacked configuration, or a concentric configuration, or a combination of stacked and concentric configuration.

According to an embodiment, the system may include one or more photovoltaic solar panels mounted on the pillar.

According to an embodiment, the photovoltaic solar panel may be mounted on top of the pillar with ball & socket joint arrangement to enable movement of the photovoltaic solar panels to track movement of sun through the day and through the seasons. Solar panels below the top of the pillar can have ball bearing connection to the pillar and this will enable the panel to track the sun.

According to an embodiment, the system may include two or more sets of gears. Each of the two or more sets of gears may be provided between a spinner unit out of the two or more spinner units and the corresponding set of electric power generators to operatively couple the spinner units and the corresponding set of electric power generators.

According to an embodiment, each of the two or more sets of gears may include a main gear coupled to a corresponding spinner unit and a set of pinion gears in engagement with the main gear around periphery of the main gear.

According to an embodiment, the system may further include two or more housings. Each of the two or more housings may be located on the pillar adjacent a corresponding spinner unit to accommodate the corresponding set of electric power generators.

According to an embodiment, each of the plurality of pinion gears may be mounted on the housing for free rotation, and may be coupled to an electric power generator of the corresponding set of electric power generators.

According to an embodiment, each of the plurality of pinion gears may be coupled to a rotor of the corresponding electric power generator, and a corresponding stator of the electric power generator may be fixed to the housing.

According to an embodiment, the system may include a plurality of pillars located adjacent to each other to form an array of pillars, to make a power garden.

According to an embodiment, at least one of the plurality of pillars may be located on a sea shore to tap the renewable energy from waves of sea water.

According to an embodiment, the system may include at least one sea wave governor chamber for directing water from sea waves to the corresponding spinner unit located near the base portion of the at least one pillar to facilitate a smoother and substantially continuous flow.

According to an embodiment, the at least one sea wave governor chamber may include an outlet door having a plurality of vertically oriented slits with progressively reducing slope. The progressively reducing slope of the slits may be configured to direct water from sea waves to a desired location on the spinner unit, say for example, directing the flow from left to right so that the blades will always turn clockwise.

According to an embodiment, the outlet door may be pivoted along an upper side for movement between an open position and a closed position. The pivoted outlet door may also be biased by a tension rope towards the closed position.

According to an embodiment, the at least one sea wave governor chamber may include a horizontally oriented awning like plate fixed to the outlet door along an upper side of the outlet door.

According to an embodiment, the at least one sea wave governor chamber may include an inlet door that opens to allow sea water to enter the least one sea wave governor chamber under influence of the sea waves, and closes to prevent the sea water from going back when the sea waves recede.

According to an embodiment, the at least one sea wave governor chamber may include a duct on an outlet side to direct water from sea waves to a desired location on the spinner unit.

According to an embodiment, a long governor chamber with multiple spinners and without the solar panel or wind spinner units is provided.

According to an embodiment, the power chamber is below the spinners for the wind driven units.

According to an embodiment, the power chamber is above the spinners for the water driven units.

Various objects, features, aspects and advantages of the inventive subject matter will become more apparent from the following detailed description of preferred embodiments, along with the accompanying drawing figures in which like numerals represent like components.

DETAILED DESCRIPTION

Figure 1:
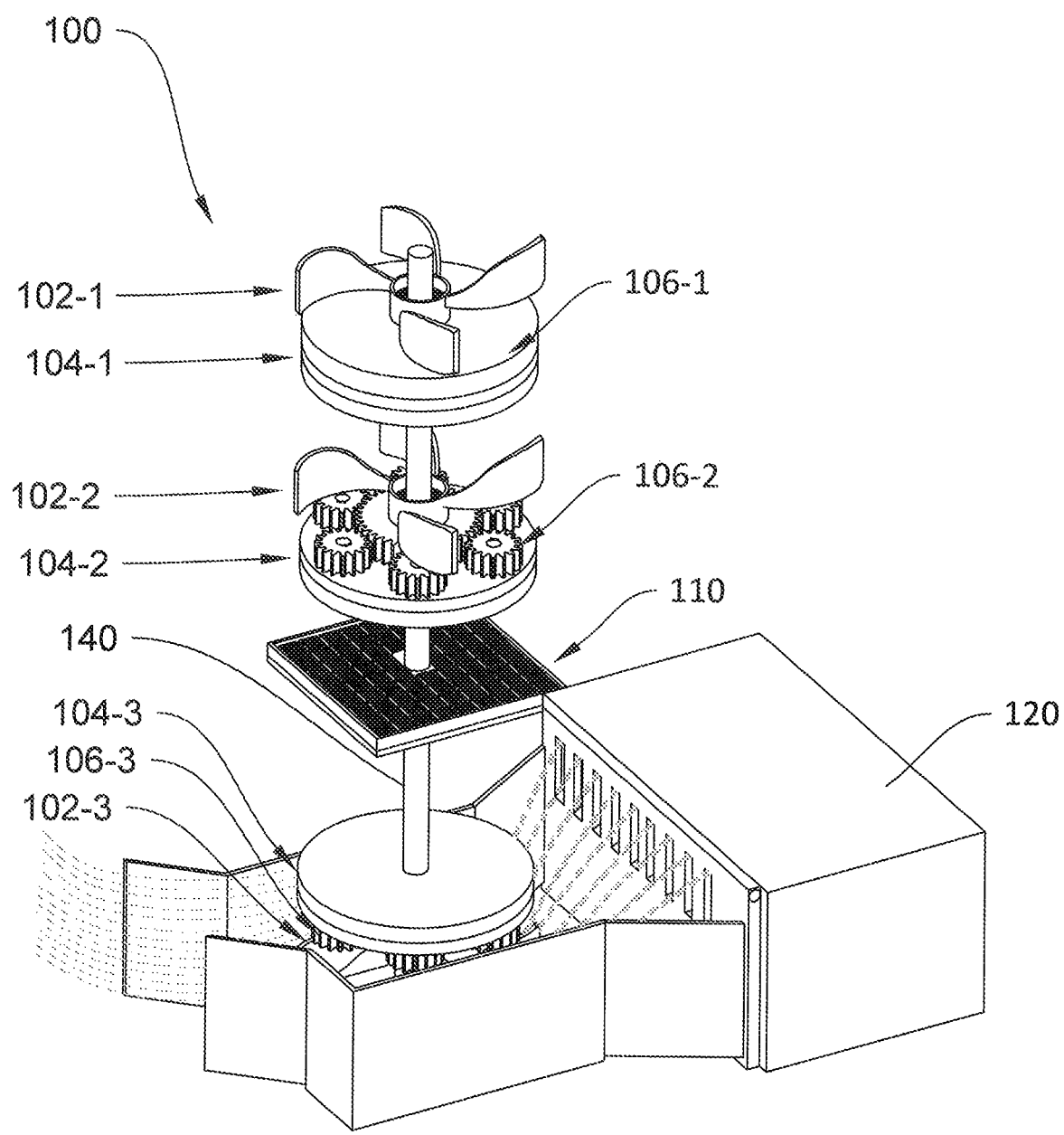
FIG. 1 illustrates an exemplary perspective view of the proposed multimodal renewable energy generation system showing spinner units and photovoltaic panel mounted on a vertical pillar in accordance with various embodiments.

The following is a detailed description of embodiments of the disclosure depicted in the accompanying drawings. The embodiments are in such detail as to clearly communicate the disclosure. However, the amount of detail offered is not intended to limit the anticipated variations of embodiments; on the contrary, the intention is to cover all modifications, equivalents, and alternatives falling within the spirit and scope of the present disclosure as defined by the appended claims.

Each of the appended claims defines a separate invention, which for infringement purposes is recognized as including equivalents to the various elements or limitations specified in the claims. Depending on the context, all references below to the "invention" may in some cases refer to certain specific embodiments only. In other cases it will be recognized that references to the "invention" will refer to subject matter recited in one or more, but not necessarily all, of the claims. As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Various terms are used herein. To the extent a term used in a claim is not defined, it should be given the broadest definition persons in the pertinent art have given that term as reflected in printed publications and issued patents at the time of filing.

Conventional systems for generating electricity from the renewable energy sources are typically configured to harness energy from one of the many known renewable energy sources. Therefore, they suffer from drawback of inability to generate power when the corresponding renewable energy source is not available. To provide uninterrupted power supply, these systems incorporate battery banks to store power for consumption when there is no generation of power. Alternatively, they depend on grid power during the period of non-generation of power. For systems that have long non-generation periods, such as those depending on solar radiations, capacity of the battery pack needed for continuous power supply without depending on grid supply becomes large making the system costly and beyond reach of many consumers.

It is an objective of the present disclosure to provide an improved renewable energy power generation system that significantly reduces the capacity of the battery pack needed for continuous power supply, thereby reducing cost of the system. The reduction is achieved by harnessing energy from more than one renewable energy sources so that at least one of these renewable energy sources is likely to be available at any given instance.

Another objective of the present disclosure is to provide a compact renewable energy power generation system that has capability of harnessing renewable energy from solar radiation, wind and sea waves, and accordingly referred to as multimodal renewable energy generation system.

Referring now to FIG. 1, where an exemplary perspective view of the proposed multimodal renewable energy generation system is disclosed in accordance with various embodiments herein. The multimodal renewable energy generation system 100 includes two or more spinner units, such as spinner units 102-1, 102-2 and 102-3 (hereinafter individually/collectively referred to as spinner unit(s) 102). The spinner units 102 can be arranged on a vertical pillar 140 for free rotation. The spinner units 102 can be configured to rotate under influence of wind stream of a fluid, such as a stream of air, commonly known as wind, or a stream of water. In the exemplary illustration of FIG. 1, the spinner units 102-1 and 102-2, which are located at an upper portion of the pillar 140, are configured to rotate under influence of wind, and the spinner unit 102-3, which are located at a bottom portion of the pillar 140, is configured to rotate under influence of water stream directed to the spinner unit 102-3. The blades of spinner units 102-3 are partially dipped into the water so that they turn with the water flow but with less resistance than if the blades were entirely under water. In the exemplary illustration of FIG. 1, the water stream is generated by a sea wave governor chamber 120.

It is to be appreciated that though the exemplary illustration of FIG. 1 shows the water stream generated by the sea wave governor chamber 120 to harness energy from sea waves, it is possible to have other arrangements to harness hydropower from other sources of stream of water. For example, it is possible to channel flowing water of a river or water from a dam to rotate the spinner unit 102-3.

The multimodal renewable energy generation system 100 further includes two or more sets of electric power generators, such as set of electric power generators 104-1 and 104-2 and 104-3 (hereinafter individually and collectively referred to as set of electric power generator(s) 104), such that one set of electric power generator 104 is operatively coupled to each of the spinner units 102 to generate electric power when the corresponding spinner unit 102 rotates under the influence of the stream of the corresponding fluid, i.e. air or water. The operative coupling of the set of electric power generator 104 to the corresponding spinner units 102 can be through a coupling unit, such as coupling units 106-1, 106-2 and 106-3 (hereinafter individually and collectively referred to as coupling unit(s) 106). Units 106-1 (which is shown covered by a cover/casing) and 106-2 are located below the spinner units, whereas unit 106-3 is located above the spinner units. (Units 106-2, 106-3 are also covered by a casing.) In one or embodiments, a lowermost of the two or more coupling units/housings is located above the spinner unit.

Figure 4A:
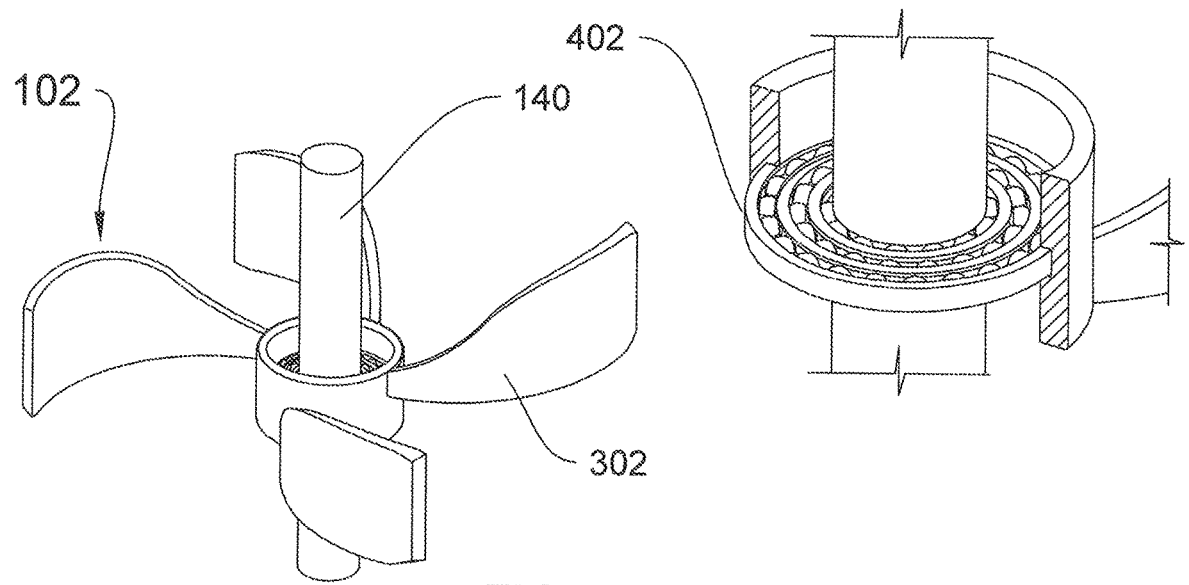
FIGS. 4A-4C illustrate exemplary views showing different arrangements of bearings that support the spinner unit to the vertical pillar for frictionless rotation of the spinner units in accordance with different embodiments.
Figure 4B:
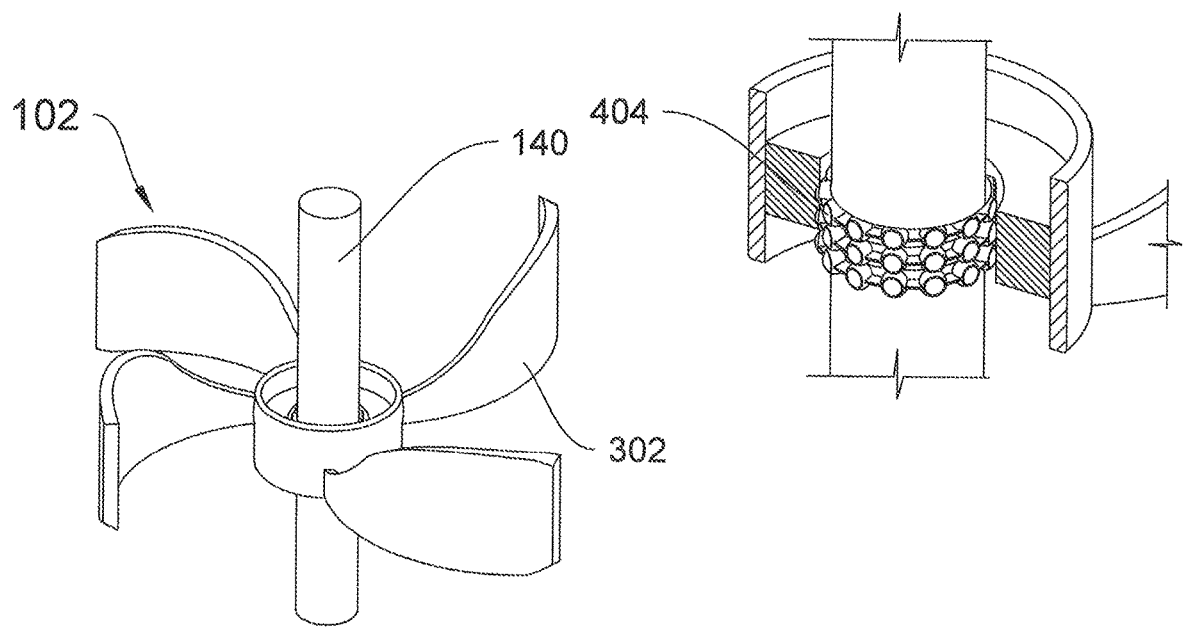
Figure 4C:
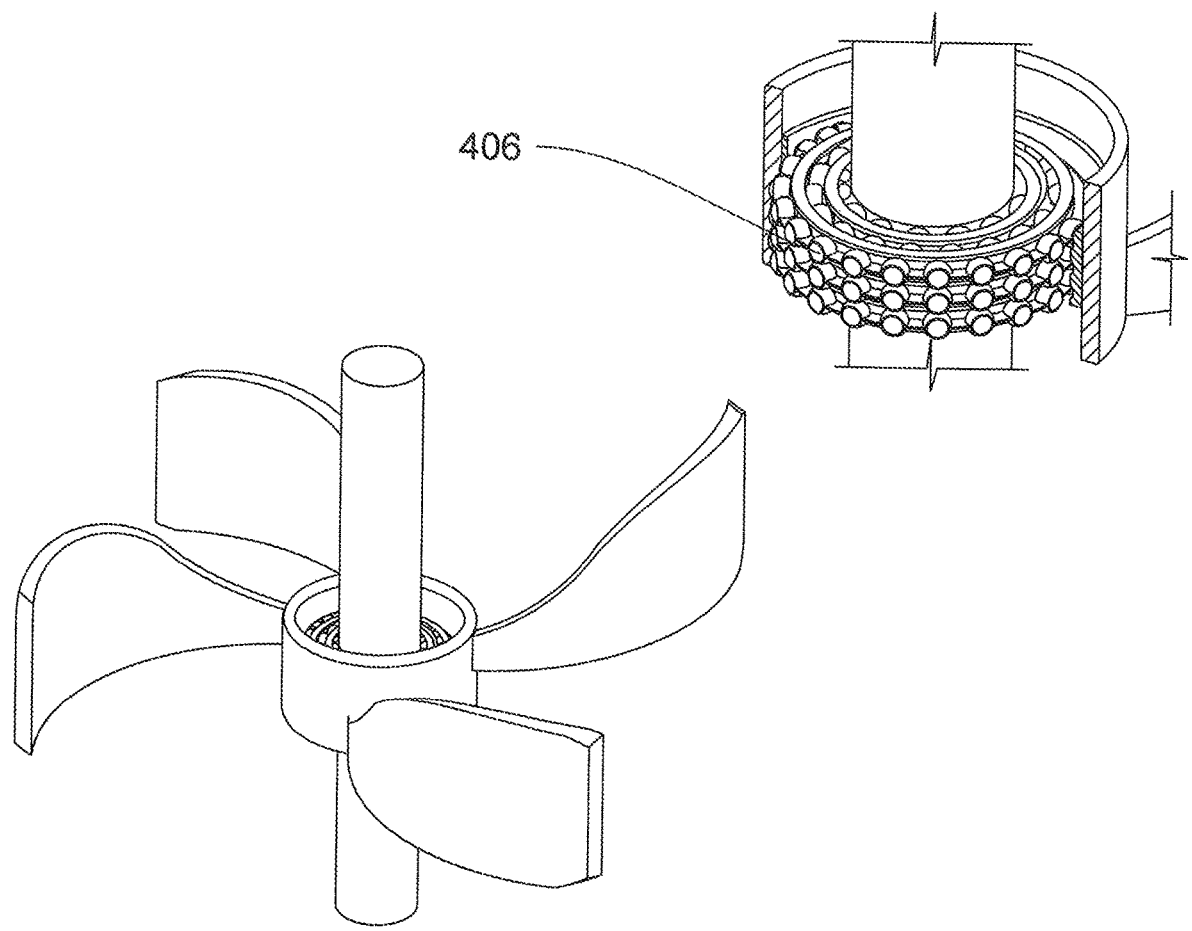

As shown in the exemplary illustration of FIG. 1, the spinner units 102 can be configured for free rotation in a horizontal plane about an axis coinciding with a longitudinal axis of the vertical pillar 140. The horizontal configuration of the spinner units 102 provides an advantage of turning even at less powerful winds or water stream, and can be kept turning for a longer time. The spinner units 102 can be horizontally mounted of the pillar 140 for free rotation by means of a set of bearings as shown in FIGS. 4A, 4B and 4C. As shown therein, the set of bearings can be arranged between the pillar and the spinner unit in a concentric configuration 402 with multiple bearings in one plane as shown in FIG. 4A, or a stacked configuration 404 as shown in FIG. 4B, or a combination of stacked and concentric configurations 406 as shown in FIG. 4C. The stacked configuration 404 of FIG. 4B can be advantageous for maintaining the horizontal level of the spinner unit 102.

Figure 2A:
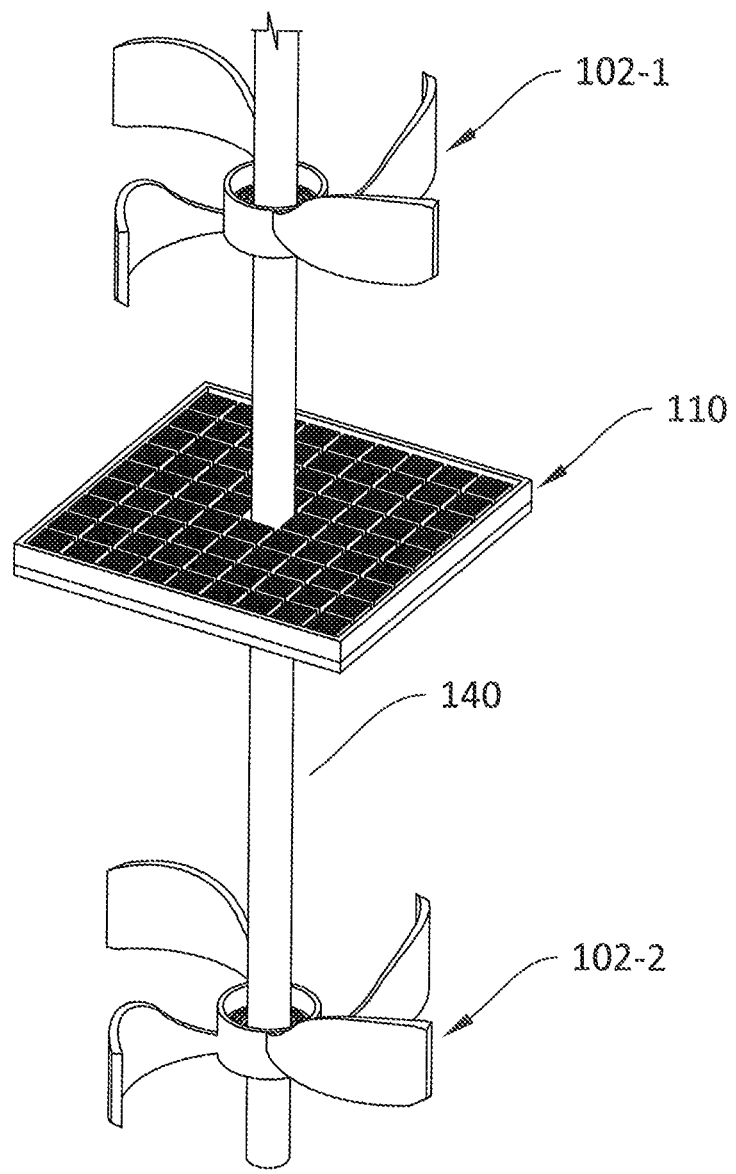
FIGS. 2A-2B illustrate examples of implementation of the spinner units on a vertical pillar in accordance with various embodiments.
Figure 7:
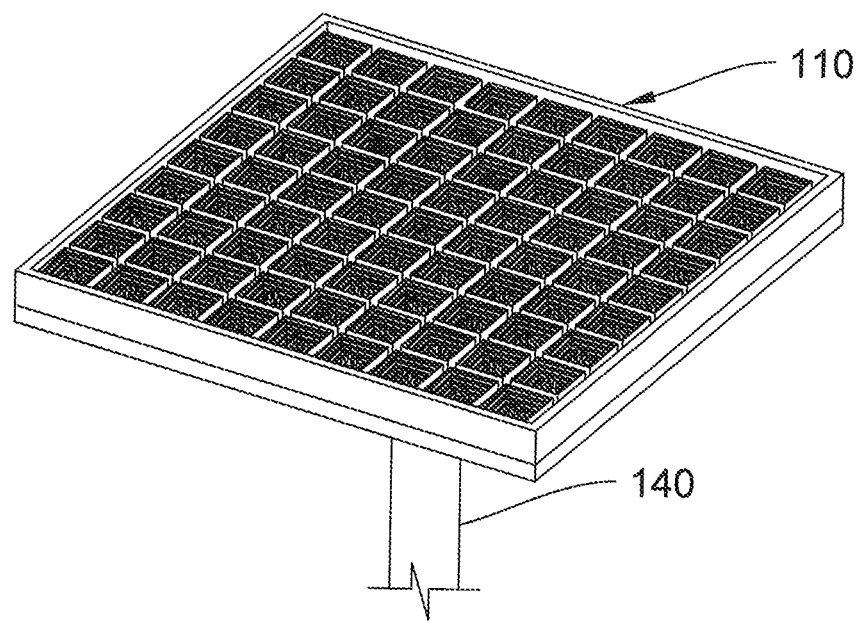
FIG. 7 illustrates a photovoltaic solar panel configured at an upper end of the vertical pillar in accordance with an embodiment.

Referring back to FIG. 1, the system 100 can also include one or more photovoltaic solar panel 110 mounted on the pillar 140 for harnessing solar radiations. The solar panel 110 can be mounted on the pillar 140 between the spinner units 102, as shown in FIG. 2A, or at an upper end of the pillar 140, as shown in FIG. 7. The mounting of the photovoltaic solar panels 110 on the top of the pillar 140, as in FIG. 7, can be through a ball & socket joint arrangement (not shown), as known in the related art. The ball & socket joint arrangement can enable movement of the photovoltaic solar panels 110 to track movement of sun through the day and through the seasons to maximize the harnessed power. Solar panels 110 below the top of the pillar can have ball bearings to allow tilting of the panels to follow the sun.

Figure 2B:
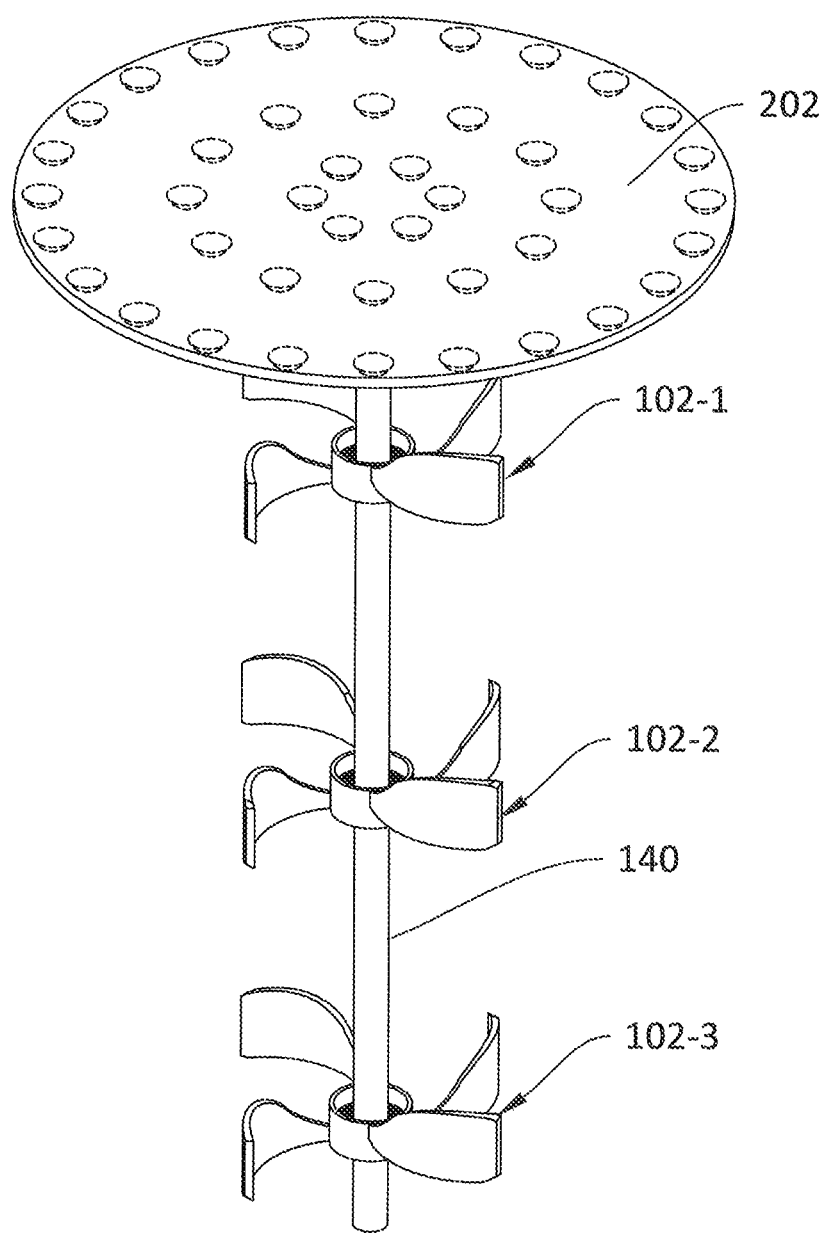

In application, as shown in FIG. 2B, the spinner units 102 can be mounted on a light pillar having a light 202 and power generated by the system 100 can be used to power the light 202. In practice, it is possible to install the spinner units 102 to existing light pillars, power line pillars, telephone pillars and any other vertically standing pillars with or without solar panels at the top, or the bottom, or anywhere in between.

Figure 3A:
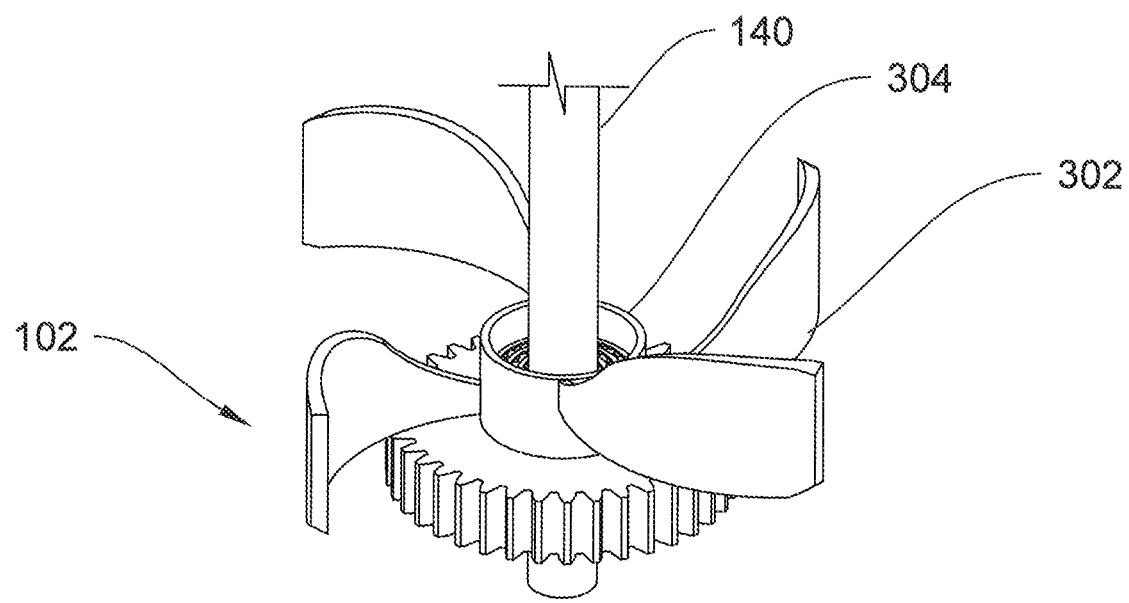
FIG. 3A illustrates an exemplary perspective view showing a main gear coupled to the spinner unit in accordance with an embodiment.
Figure 3B:
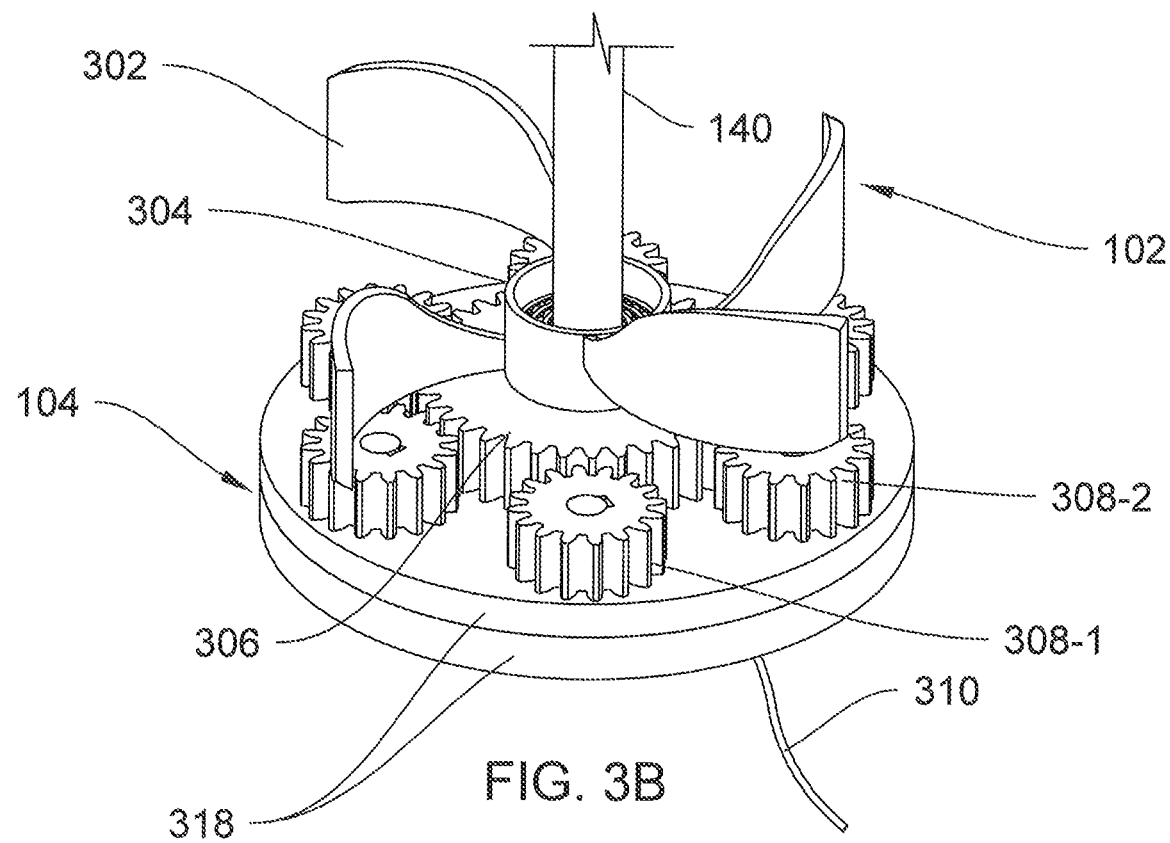
FIG. 3B illustrates an exemplary schematic view showing details of pinion gears arranged around the main gear in accordance with an embodiment.

FIGS. 3A through 3B show details of the coupling unit 106 (refer to FIG. 1) that couple the spinner unit 102 to the set of electric power generators 104. As shown in FIGS. 3A and 3B, each of the coupling units 106 is made up of a set of gears. The set of gears includes a main gear 306 coupled to a hub 304 of the spinner unit 102 for rotation along with the spinner unit 102 and a plurality of pinion gears, such as pinion gears 308-1 and 308-2 (collectively referred to as pinion gear 308). The pinion gears 308 can be pivotally fixed on a housing 318 of the corresponding electric power generator 104 around the main gear 306 such that when the main gear 306 rotates along with the spinner unit 102, the pinion gears 308 also rotate about their respective pivot axis.

Also shown in FIG. 3A are further details of the spinner unit 102. As shown, the spinner unit 102 can have the hub 304 that is mounted on the pillar 140 through the set of bearings 402, 404, 406 (refer to FIGS. 4A-4C), and a plurality of blades 302. The blades 302 can be cup shaped having a concave side and a convex side. The cup shape of the blades 302 can be configured such that force exerted by the stream of the corresponding fluid on concave side of the blades is more than force exerted by the same stream on convex side of the blades to make the spinner unit rotate in a preferred direction irrespective of direction of wind or water stream. In an alternate embodiment, the stream of fluid may be directed to the concave side of the blades 302 preventing the stream from impinging on the convex side of the blade 302. Such an arrangement can help in improving power harnessing efficiency of the spinner unit 102.

In accordance with an embodiment, in order to avoid the inertia of the spinning unit preventing start of rotation from a complete stop at low energy wind or water streams, the system 100 can incorporate means to recycle a small amount of energy to keep the spinning unit rotating at a low speed even when there is no external source, i.e. wind or water stream.

Figure 3C:
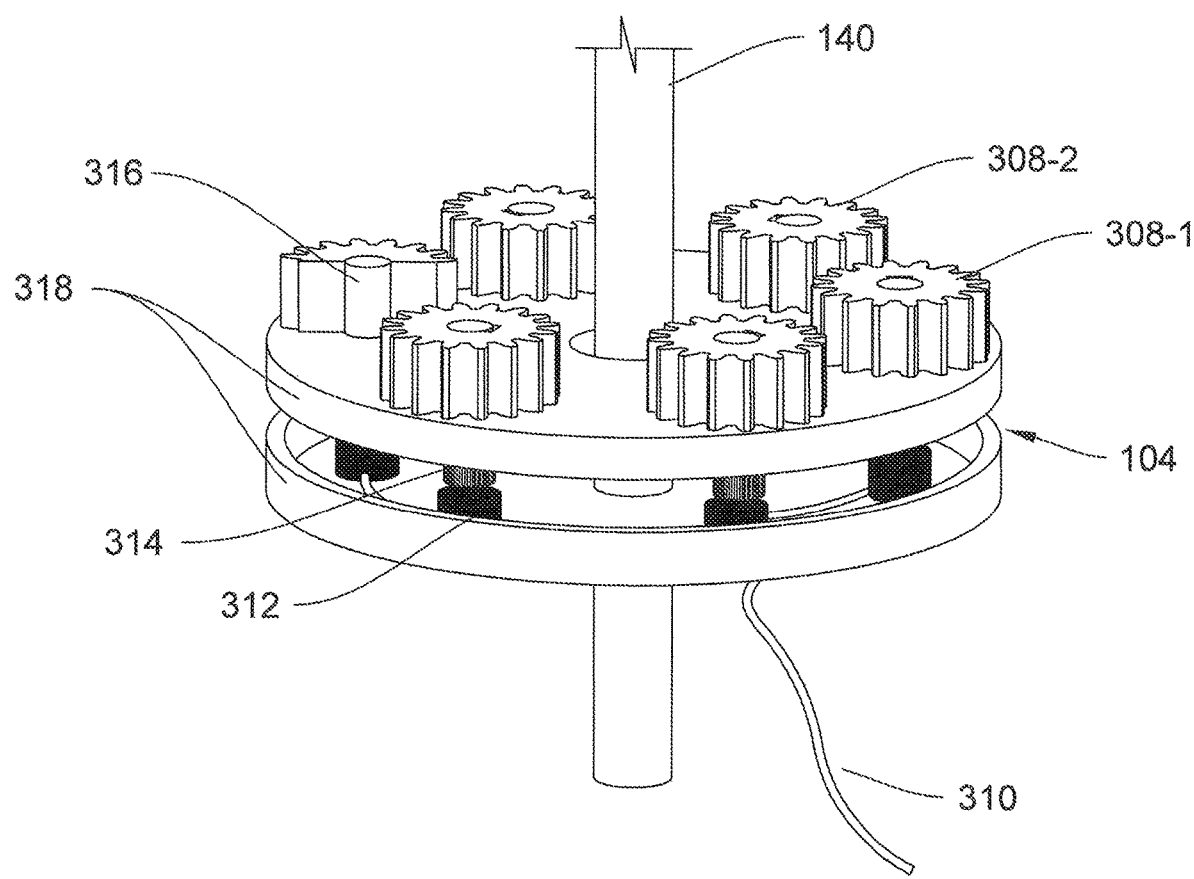
FIG. 3C illustrates an exemplary exploded view of the electric power generators showing pinion gears coupled to the electric power generators in accordance with an embodiment.

FIG. 3C shows an exploded view of the electric power generators 104 showing pinion gears 308 coupled to the electric power generators. As shown, each of the pinion gears 308 can be fixed to one end of a shaft 316 that rotates freely relative to the housing 318. Other end of the shaft 316 can be coupled to a rotor 314 of an electric power generator of the set of electric power generators 104 so that the rotor 314 rotates along with the pinion gear 308. The rotor 314 can be located within a stator 312 of the corresponding electric power generator. The stator 312 can include coils and the rotor 314 can have magnets. Therefore, when the rotor 314 rotates along with the pinion gear 308 electric power is generated by the coils of the stator 312, which is harnessed through cable 310.

Figure 5A:
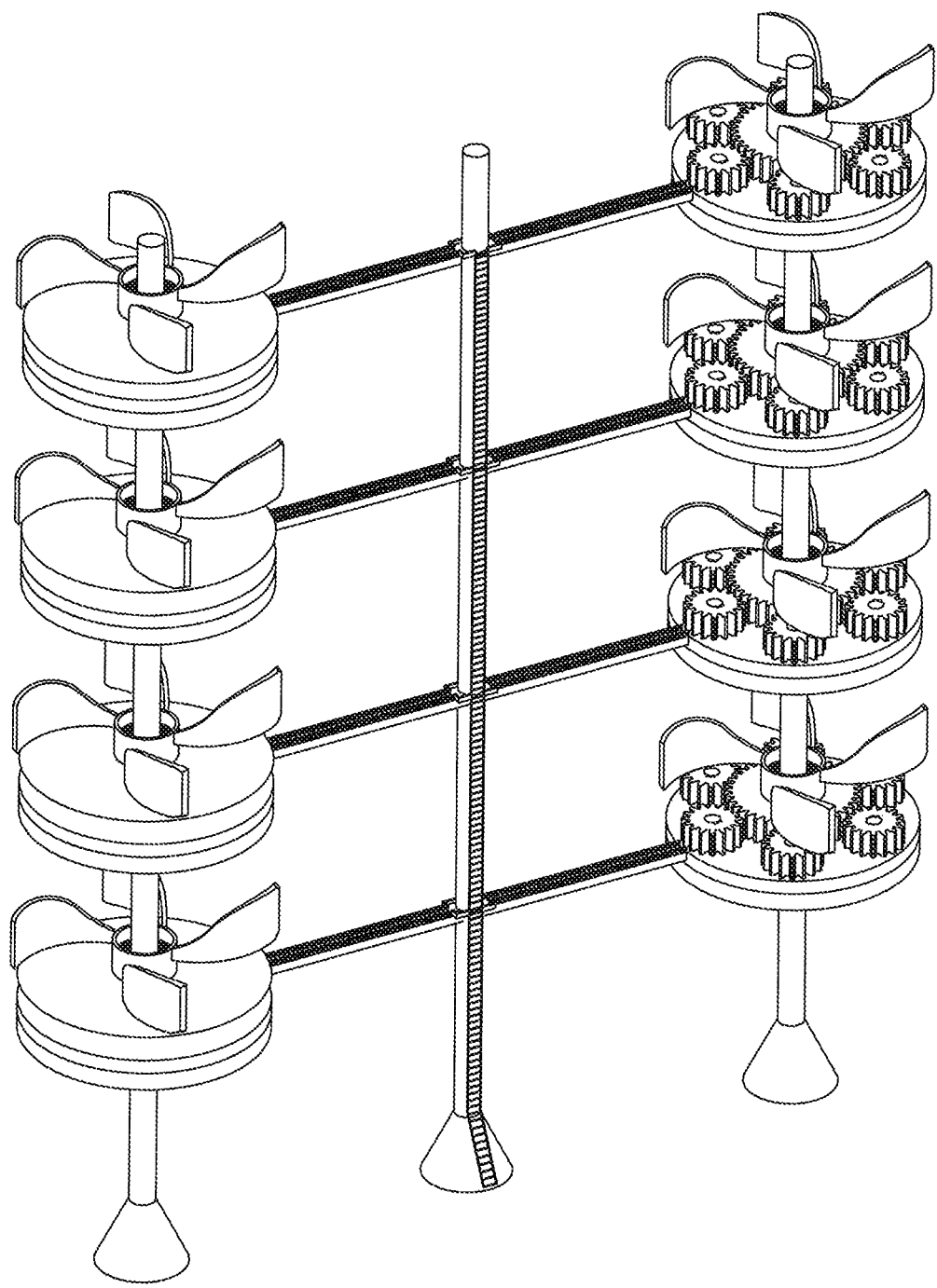
FIGS. 5A-5B illustrate exemplary views showing arrangement of a number of vertical pillars to create an array of spinner units in accordance with different embodiments.
Figure 5B:
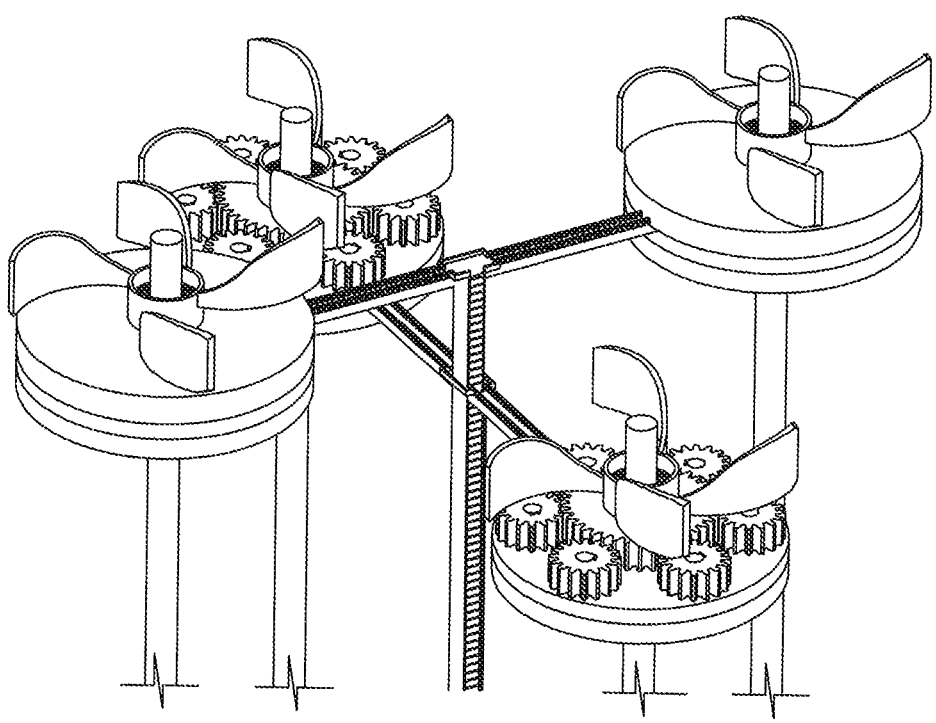
Figure 6:
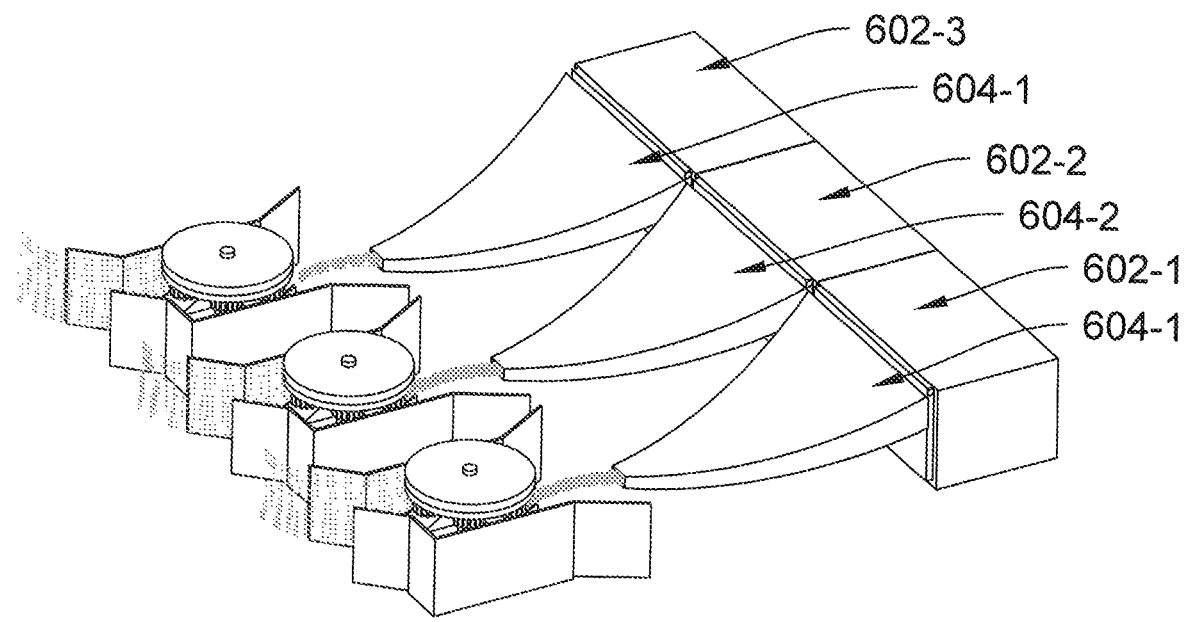
FIG. 6 illustrates a series of water governor chambers for directing water to multiple spinner units in accordance with an embodiment.

FIGS. 5A and 5B illustrate exemplary views showing arrangement of a number of vertical pillars to create an array of multiple spinner units in in different planes to harness wind energy. FIG. 5A shows a central pillar with a ladder and walkways for the purpose of repair. FIG. 6 shows free standing multiple water units with an elongated/long water governor chambers 602-1, 602-2 and 602-3 without the wind units and the solar units for directing water to the spinner units using water ducts 604-1, 604-2 and 604-2. The long governor chamber directs water from sea waves to a plurality of aquatic spinners.

Figure 8A:
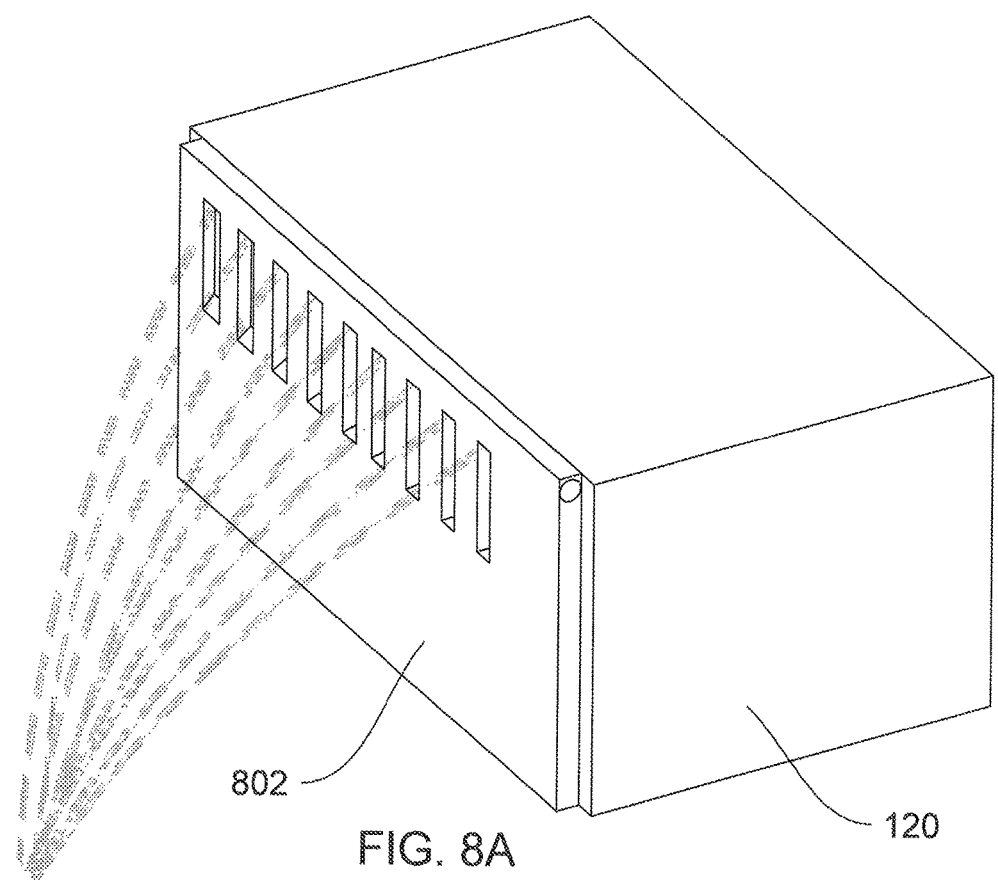
FIG. 8A illustrates an exemplary perspective view of a sea wave governor chamber for directing water from sea waves to the spinner unit in accordance with an embodiment.
Figure 8B:
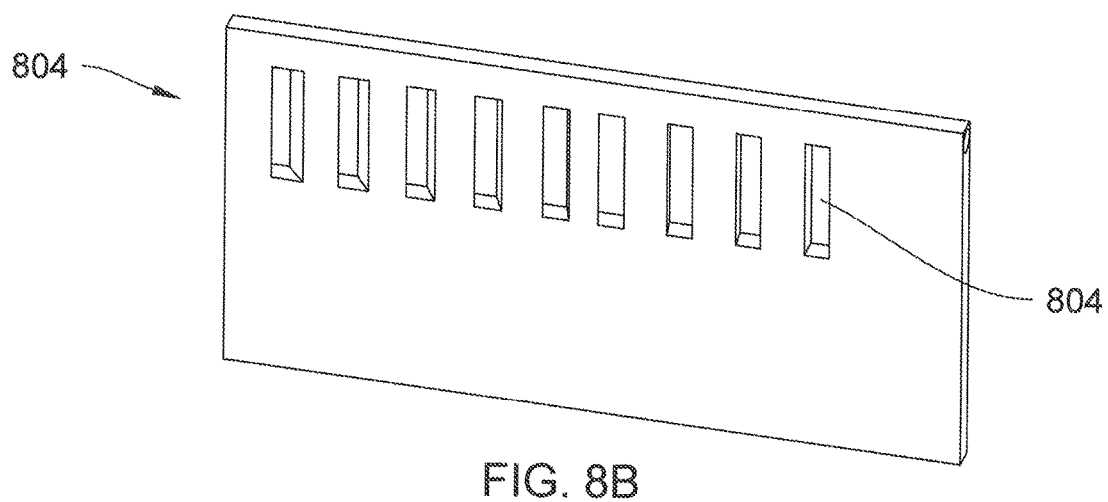
FIG. 8B shows an exemplary outlet door of the sea wave governor chamber having slits with varying window angles for directing water from sea waves to a desired location on the spinner unit in accordance with an embodiment.
Figure 8C:
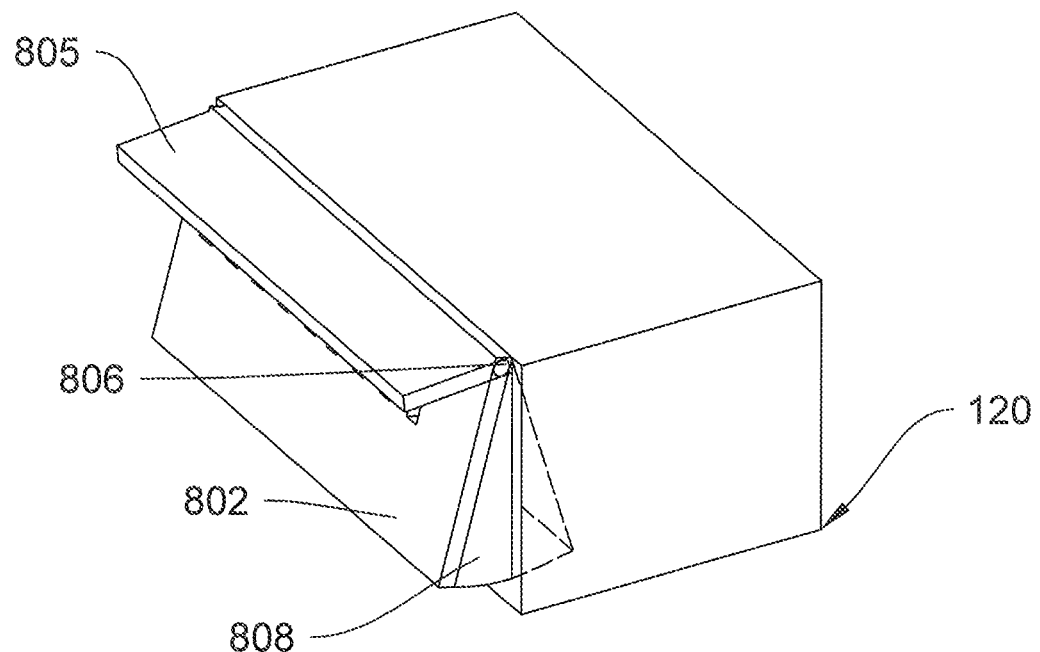
FIG. 8C shows pivotal fixing of the outlet door to an upper side of the sea wave governor chamber in accordance with an embodiment.
Figure 8D:
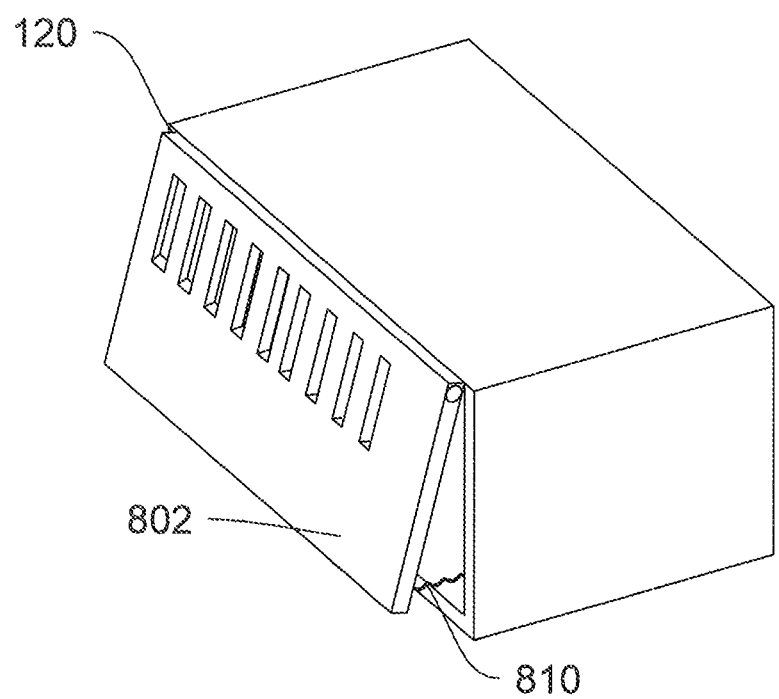
FIG. 8D shows the outlet door biased toward a closed position by a tensioner rope in accordance with an embodiment.

FIGS. 8A to 8E show different features of the sea wave governor chamber 120 for directing water from sea waves to the spinner unit 102. The sea wave governor chamber 120 can include an outlet door 802 that is pivotally fixed about an upper side of the sea wave governor chamber 120 for movement between an open position and a closed position about a pivot axis 806 as shown in FIG. 8C. The pivoted outlet door 802 may also be biased by a tension rope 810 towards the closed position as shown in FIG. 8D. Two side triangular plates 808 can be provided on two opposite vertical sides of the outlet door 802 that slide along the side walls of the sea wave governor chamber 120 to prevent water from escaping through side gaps during movement of the outlet door 802. The outlet door 802 includes a plurality of vertically oriented slits 804 with progressively reducing slope as shown in FIG. 8B. The progressively reducing slope of the slits 804 can be configured to direct water from sea waves to a desired location on the spinner unit 102 such that the blades can turn in one direction only.

Figure 8E:
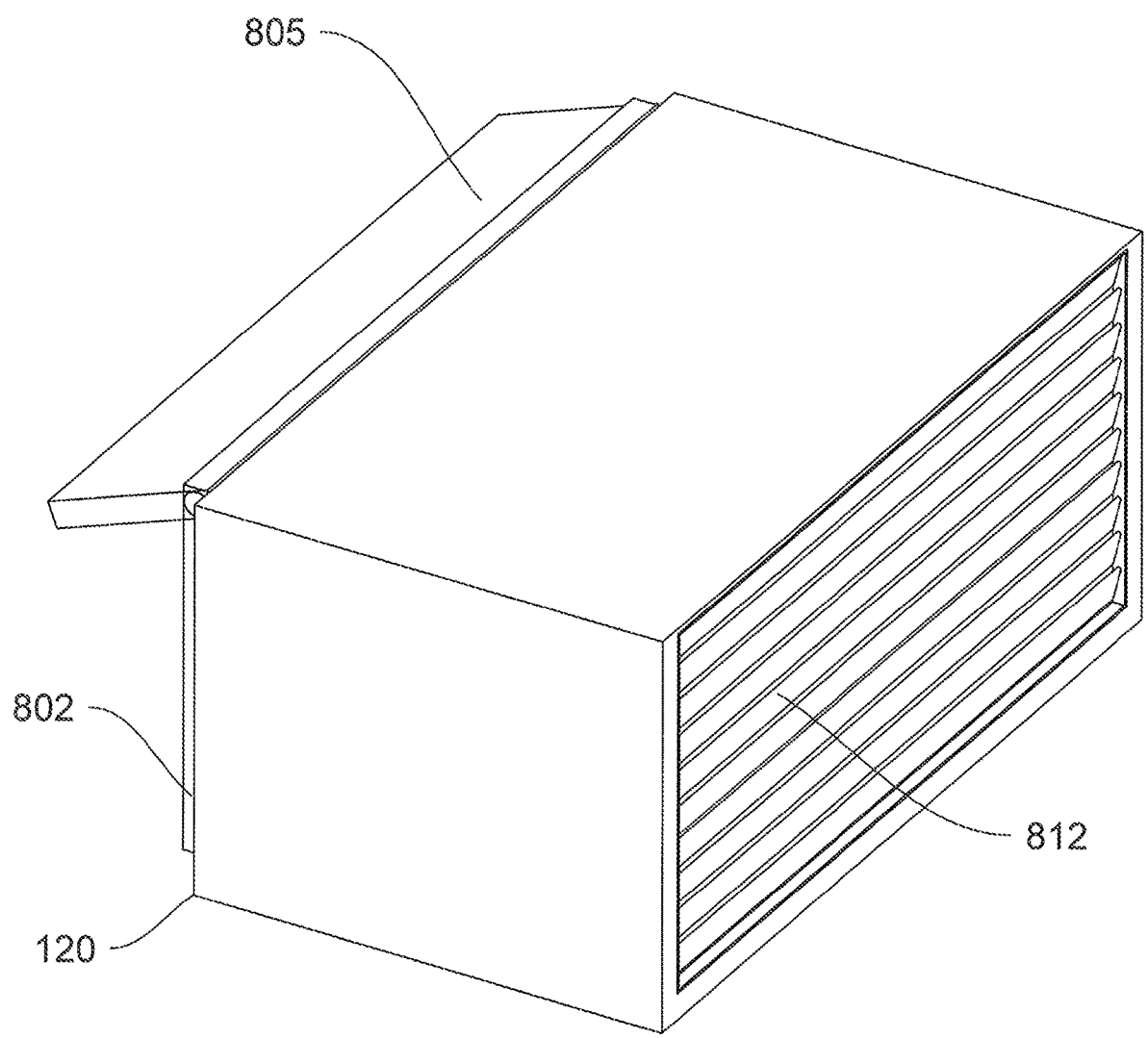
FIG. 8E shows an inlet door of the sea wave governor chamber having multiple long blades in accordance with an embodiment.

The sea wave governor chamber 120 can further include a horizontally oriented awning like plate 805, as shown in FIGS. 8C and 8E, fixed to the outlet door 802 along an upper side of the outlet door 802. The awning like plate 805 directs water downwards towards the corresponding spinner unit 102.

According to an embodiment, the at least one sea wave governor chamber may include an inlet door 812, as shown in FIG. 8E, that opens to allow sea water to enter the sea wave governor chamber 120 under influence of the sea waves, and closes to prevent the sea water from going back when the sea waves recede.

Figure 9:
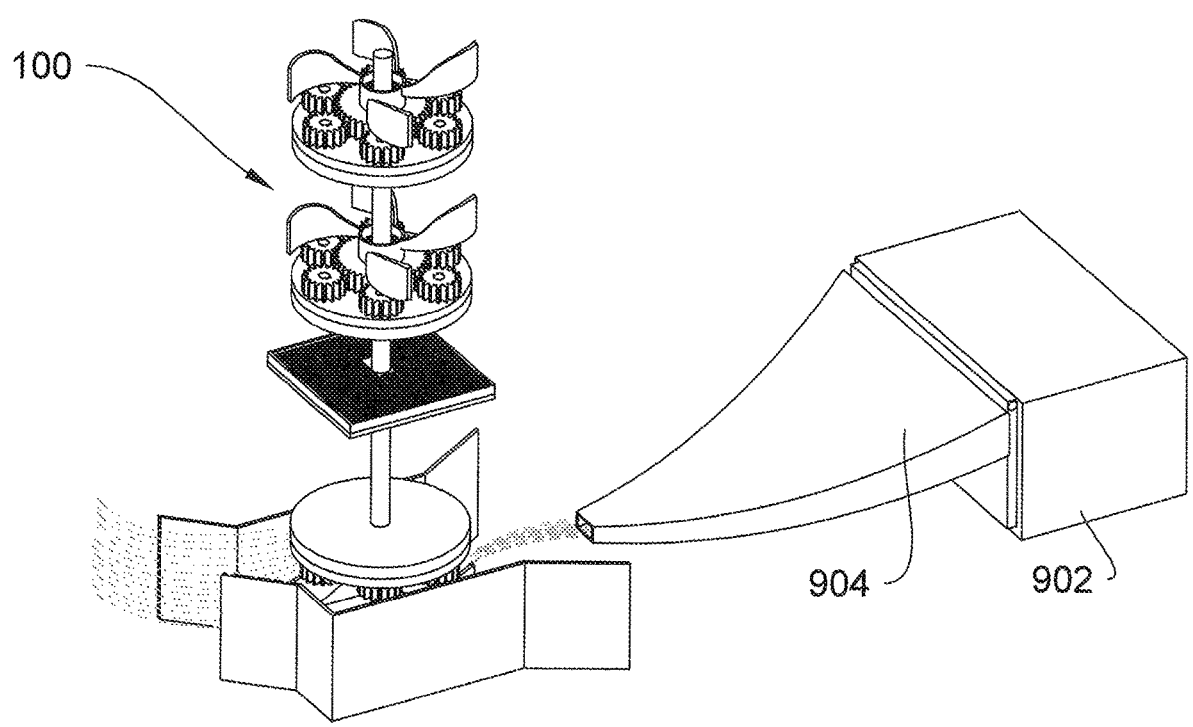
FIG. 9 illustrates an exemplary view of an alternate sea wave governor chamber for directing water from sea waves to the spinner unit in accordance with an embodiment.

In an alternate embodiment, FIG. 9 shows an alternate sea wave governor chamber 902 that includes a duct 904 on an outlet side to direct water from sea waves to a desired location on the spinner unit 102, such as concave side of the blades 302 of the spinner unit 102. This facilitates a smoother and substantially continuous water flow.

Thus, the multimodal renewable energy generation system is a compact and improved arrangement that allows harnessing of electric power from more than one renewable energy sources, such as solar radiations, wind and sea waves. Ability to harness power from more than one renewable energy helps to improve uninterrupted availability of the harnessed power.

The disclosed embodiments may be implemented within the same travelling valve or within separate travelling valves to support the various techniques described in this disclosure. Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

While the foregoing describes various embodiments of the invention, other and further embodiments of the invention may be devised without departing from the basic scope thereof. The scope of the invention is determined by the claims that follow. The invention is not limited to the described embodiments, versions or examples, which are included to enable a person having ordinary skill in the art to make and use the invention when combined with information and knowledge available to the person having ordinary skill in the art.

The invention claimed is:

1. A multimodal renewable energy generation system for generating electric power from more than one renewable energy sources, the system comprising:
   two or more spinner units configured on a vertical pillar, each of the two or more spinner units configured for rotation under influence of a stream of one of at least two corresponding fluids; and
   a set of electric power generators operatively coupled to each of the two or more spinner units to generate electric power when the corresponding spinner unit rotates;

wherein at least one of the two or more spinner units is configured close to a base portion of the pillar, and a first corresponding fluid is water; and wherein the remaining of the two or more spinner units are configured with an upper portion of the pillar, and a second corresponding fluid is air, wherein or more sets of gears comprises a main gear coupled to a corresponding spinner unit and a plurality of pinion gears in engagement with the main gear around a periphery of the main gear, wherein each of the plurality of pinion gears is mounted on a housing for free rotation, and coupled to an electric power generator of the corresponding set of electric power generators, and wherein each of the plurality of pinion gears is coupled to a rotor of the corresponding electric power generator with a corresponding stator of the electric power generator being fixed to the housing.

2. The system according to claim 1, wherein each of the two or more spinner units comprises a plurality of blades that are cup shaped such that force exerted by the stream of the corresponding fluid on concave side of the blades is more than the force exerted by the same stream on a convex side of the blades to make the spinner unit rotate in a preferred direction.

3. The system according to claim 1, wherein each of the two or more spinner units is mounted on the pillar through a set of bearings, and wherein the set of bearings is arranged between the pillar and the spinner unit in a stacked configuration, or a concentric configuration, or a combination of stacked and concentric configuration.

4. The system according to claim 1, wherein the system further comprises each of the two or more sets of gears provided between one spinner unit out of the two or more spinner units and the corresponding set of electric power generators to operatively couple the spinner units and the corresponding set of electric power generators, where the power generators are located below the spinner unit.

5. The system according to claim 1, wherein the system further comprises each of the two or more sets of gears provided between one spinner unit out of the two or more spinner units and the corresponding set of electric power generators to operatively couple the spinner units and the corresponding set of electric power generators, where the power generators are located above the spinner unit.

6. The system according to claim 1, wherein the system further comprises two or more housings, each of the two or more housings located on the pillar below the spinner unit to accommodate the corresponding set of electric power generators.

7. The system according to claim 6, wherein a lowermost of the two or more housings is located above the spinner unit.

8. The system according to claim 1, wherein the system comprises a plurality of pillars located adjacent to each other to form an array of pillars.

9. The system according to claim 8, wherein at least one of the plurality of pillars is located on a sea shore to tap the renewable energy from waves of sea water.

10. The system according to claim 9, wherein the system comprises at least one sea wave governor chamber for directing water from sea waves to the corresponding spinner unit located near the base portion of the at least one pillar to facilitate a smoother and substantially continuous water flow.

11. The system according to claim 10, wherein the at least one sea wave governor chamber comprises an outlet door, the outlet door comprising a plurality of vertically oriented slits with progressively reducing slope to direct water from sea waves to a desired location on the spinner unit such that the blades are turned in only one direction.

12. The system according to claim 11, wherein the outlet door is pivoted along an upper side for movement between an open position and a closed position, and wherein the pivoted outlet door is biased by a tension rope towards the closed position.

13. The system according to claim 11, wherein the at least one sea wave governor chamber comprises a horizontally oriented awning like plate fixed to the outlet door along an upper side of the outlet door.

14. The system according to claim 10, wherein the at least one sea wave governor chamber comprises an inlet door that opens to allow sea water to enter the at least one sea wave governor chamber under influence of the sea waves, and closes to prevent the sea water from going back when the sea waves recede.

15. The system according to claim 10, wherein the at least one sea wave governor chamber comprises a duct on an outlet side to direct water from sea waves to a desired location on the spinner unit, to make the spinner unit turn in one direction only.

16. The system according to claim 1, wherein the system comprises a long governor chamber for directing water from sea waves to a plurality of aquatic spinners.

17. A multimodal renewable energy generation system for generating electric power from more than one renewable energy sources, the system comprising:

two or more spinner units configured on a vertical pillar, each of the two or more spinner units configured for rotation under influence of a stream of at least two corresponding fluids; and a set of electric power generators operatively coupled to each of the two or more spinner units to generate electric power when the corresponding spinner unit rotates;

wherein at least one of the two or more spinner units is configured close to a base portion of the pillar, and a first corresponding fluid is water, wherein the remaining of the two or more spinner units are configured with an upper portion of the pillar, and a second corresponding fluid is air, wherein the system comprises a plurality of pillars located adjacent to each other to form an array of pillars, wherein at least one of the plurality of pillars is located on a sea shore to tap the renewable energy from waves of sea water, and wherein the system comprises at least one sea wave governor chamber for directing water from sea waves to the corresponding spinner unit located near the base portion of the at least one pillar to facilitate a smoother and substantially continuous water flow, and wherein the at least one sea wave governor chamber comprises an outlet door, the outlet door comprising a plurality of vertically oriented slits with progressively reducing slope to direct water from sea waves to a desired location on the spinner unit such that the blades are turned in only one direction.

18. The system according to claim 17, wherein the two or more spinner units are configured for rotation in a horizontal plane about an axis coinciding with a longitudinal axis of the vertical pillar.

19. The system according to claim 18, wherein each of the two or more spinner units comprises a plurality of blades that are cup shaped such that force exerted by the stream of the corresponding fluid on a concave side of the blades is more than the force exerted by the same stream on a convex side of the blades to make the spinner unit rotate in a preferred direction.

20. The system according to claim 18, wherein each of the two or more spinner units is mounted on the pillar through a set of bearings, and wherein the set of bearings is arranged between the pillar and the spinner unit in a stacked configuration, or a concentric configuration, or a combination of stacked and concentric configuration.

21. The system according to claim 17, wherein the system further comprises two or more sets of gears, each of the two or more sets of gears provided between one spinner unit out of the two or more spinner units and the corresponding set of electric power generators to operatively couple the spinner units and the corresponding set of electric power generators, where the power generators are located below the spinner unit.

22. The system according to claim 17, wherein the system further comprises two or more sets of gears, each of the two or more sets of gears provided between one spinner unit out of the two or more spinner units and the corresponding set of electric power generators to operatively couple the spinner units and the corresponding set of electric power generators, where the power generators are located above the spinner unit.

23. The system according to claim 17, wherein each of the two or more sets of gears comprises a main gear coupled to a corresponding spinner unit and a plurality of pinion gears in engagement with the main gear around a periphery of the main gear.

24. The system according to claim 23, wherein the system further comprises two or more housings, each of the two or more housings located on the pillar below the spinner unit to accommodate the corresponding set of electric power generators.

25. The system according to claim 23, wherein the system further comprises two or more housings, of the two or more housings is located above the spinner unit.

26. The system according to claim 23, wherein each of the plurality of pinion gears is mounted on a housing for free rotation, and coupled to an electric power generator of the corresponding set of electric power generators.

27. The system according to claim 26, wherein each of the plurality of pinion gears is coupled to a rotor of the corresponding electric power generator with a corresponding stator of the electric power generator being fixed to the housing.

28. The system according to claim 17, wherein the outlet door is pivoted along an upper side for movement between an open position and a closed position, and wherein the pivoted outlet door is biased by a tension rope towards the closed position.

29. The system according to claim 17, wherein the at least one sea wave governor chamber comprises a horizontally oriented awning like plate fixed to the outlet door along an upper side of the outlet door.

30. The system according to claim 17, wherein the at least one sea wave governor chamber comprises an inlet door that opens to allow sea water to enter the at least one sea wave governor chamber under influence of the sea waves, and closes to prevent the sea water from going back when the sea waves recede.

31. The system according to claim 17, wherein the at least one sea wave governor chamber comprises a duct on an outlet side to direct water from sea waves to a desired location on the spinner unit, to make the spinner unit turn in one direction only.

* * * * *